(12) United States Patent
Hwang

(10) Patent No.: US 7,449,398 B2
(45) Date of Patent: Nov. 11, 2008

(54) METHODS OF FORMING SILICON NANO-CRYSTALS USING PLASMA ION IMPLANTATION AND SEMICONDUCTOR DEVICES USING THE SAME

(75) Inventor: Hyunsang Hwang, Gwangju (KR)

(73) Assignee: Samsung Electronics Co., Ltd., Gyeonggi_Dong (KR)

( * ) Notice: Subject to any disclaimer, the term of this patent is extended or adjusted under 35 U.S.C. 154(b) by 0 days.

(21) Appl. No.: 11/452,397

(22) Filed: Jun. 14, 2006

(65) Prior Publication Data

US 2007/0117402 A1    May 24, 2007

(30) Foreign Application Priority Data

Jun. 16, 2005    (KR)    ............ 10-2005-0051995

(51) Int. Cl.
    *H01L 21/26*    (2006.01)
(52) U.S. Cl. .................. 438/513; 977/890
(58) Field of Classification Search ......... 438/758, 438/510, 513, 514, 522, 142
    See application file for complete search history.

(56) References Cited

U.S. PATENT DOCUMENTS 5,561,072 A * 10/1996 Saito ............ 438/513
6,090,666 A * 7/2000 Ueda et al. ............ 438/257
6,143,631 A * 11/2000 Chapek ............ 438/513
6,258,173 B1 * 7/2001 Kirimura et al. ............ 118/719
6,344,403 B1 * 2/2002 Madhukar et al. ............ 438/503
6,709,906 B2 * 3/2004 Yamaguchi et al. ............ 438/162

FOREIGN PATENT DOCUMENTS

KR    10-2003-0059936    7/2003

OTHER PUBLICATIONS

Fast and Long Retention-Time Nano-Crystal Memory☐☐Hussein I. Hanafi Sandip Tiwari Imran Khan, Sep. 1996, IEEE, IEEE Transactions on Electron Devices vol. 43 No. 9 pp. 1553-1558.*
Effects of Ion Bombardment upon Microcrystalline Silicon Growth☐☐B. Kalache, R. Brenot, V. Tripathi, S. Kumar, R. Vanderhaghen, P. Rocia I. Cabarrocas, 2001, Scitec Publications, Switzerland, Solid State Phenomena vols. 80-81, pp. 71-76.*
Korean Office Action for counterpart Korean Application No. 10-2005-0051995 dated Aug. 30, 2006.
English Translation of Korean Office Action for counterpart Korean Application No. 10-2005-0051995 dated Aug. 30, 2006.

* cited by examiner

*Primary Examiner*—M. Wilczewski
*Assistant Examiner*—Swapneel Chhaya
(74) *Attorney, Agent, or Firm*—Harness, Dickey & Pierce, P.L.C.

(57) ABSTRACT

In a method for forming silicon nano-crystals using plasma ion implantation and a semiconductor memory device using the same, silicon nano-crystals may be formed using plasma ion implantation. An insulating layer may be formed on a substrate, and ions may be implanted into the insulating layer using hydrogen and a gas including silicon. Silicon nano-crystals may be formed using a heat treatment.

20 Claims, 2 Drawing Sheets

METHODS OF FORMING SILICON NANO-CRYSTALS USING PLASMA ION IMPLANTATION AND SEMICONDUCTOR DEVICES USING THE SAME

PRIORITY STATEMENT

This non-provisional U.S. patent application claims priority under 35 U.S.C. § 119 to Korean Patent Application No. 10-2005-0051995, filed on Jun. 16, 2005, in the Korean Intellectual Property Office (KIPO), the entire contents of which is incorporated herein by reference.

BACKGROUND OF THE INVENTION

1. Field of the Invention

Example embodiments of the present invention relate to methods of forming silicon nano-crystals using plasma ion implantation (e.g., $SiH_4$ plasma ion implantation) and semiconductor devices using the same. At least one example embodiment of the present invention provides a method for forming silicon nano-crystals using $SiH_4$ plasma ion implantation in which hydrogen and silicon may be implanted into an insulating layer through a plasma doping process using a lower energy. A catalyst effect of hydrogen through heat treatment may form more highly concentrated silicon nano-crystals. The more highly concentrated silicon nano-crystals may be suitable for nonvolatile memory. At least one example embodiment of the present invention provides a method of forming semiconductors and/or semiconductor devices. The semiconductor devices may include the silicon nano-crystals formed according to example embodiments of the present invention.

2. Description of the Related Art

According to the related art, a tunneling oxide may be formed on silicon, a silicon area or dot may be formed on a tunneling oxide. The silicon area may store charges. Related art silicon nano-crystals may be formed using a chemical vapor deposition (CVD) process. However, the density of silicon nano-crystals formed on an insulating layer using a CVD process may not exceed about $1 \times 10^{12}$ per $cm^2$. As a result, silicon nano-crystals may not be suitable for semiconductor devices requiring higher density nano-crystals. Related art silicon nano-crystals may also be formed using a silicon ion implantation process to implant silicon ions into an insulating layer. The silicon ions may be implanted using an energy of 1 keV. However, the silicon nano-crystals formed using this related art method may not be suitable for semiconductor devices requiring higher density nano-crystals.

SUMMARY OF THE INVENTION

Example embodiments of the present invention provide methods for improving characteristics of nonvolatile memory devices in which hydrogen and a gas including silicon may be ion implanted (e.g., simultaneously). Nucleus generation may be promoted by a catalyst effect of hydrogen so that a density of a silicon area (e.g., a dot) may increase.

According to at least one method, according to an example embodiment of the present invention, silicon nano-crystals may be formed using plasma ion implantation. An insulating layer may be formed on a substrate (e.g., a silicon substrate), and ions may be implanted into the insulating layer using hydrogen and a gas including Silicon (Si). Silicon nano-crystals may be formed using a heat treatment. The insulating layer may be, for example, $SiO_2$, a tunneling insulating layer, or any other suitable insulating layer. The gas including Si may be, for example, $SiH_4$ or any other suitable gas and/or the heat treatment temperature may be about 400° C. to about 650° C., inclusive.

In at least some example embodiments of the present invention, a silicon nitride layer may be formed on the insulating layer. The ions may be implanted using plasma ion implantation. The ion implantation energy may be less than or equal to about 1 KeV and/or a concentration of the ion-implanted silicon may be greater than or equal to about $1 \times 10^{16}$ per $cm^2$. A concentration ratio of hydrogen may be greater than or equal to about 90%. An $SiO_2$, a high-k insulating layer, or combination thereof may be formed on the silicon nano-crystals. The $SiO_2$ or the high-k insulating layer may be formed using chemical vapor deposition (CVD) or any other suitable deposition process.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE PRESENT INVENTION

Figure 1:
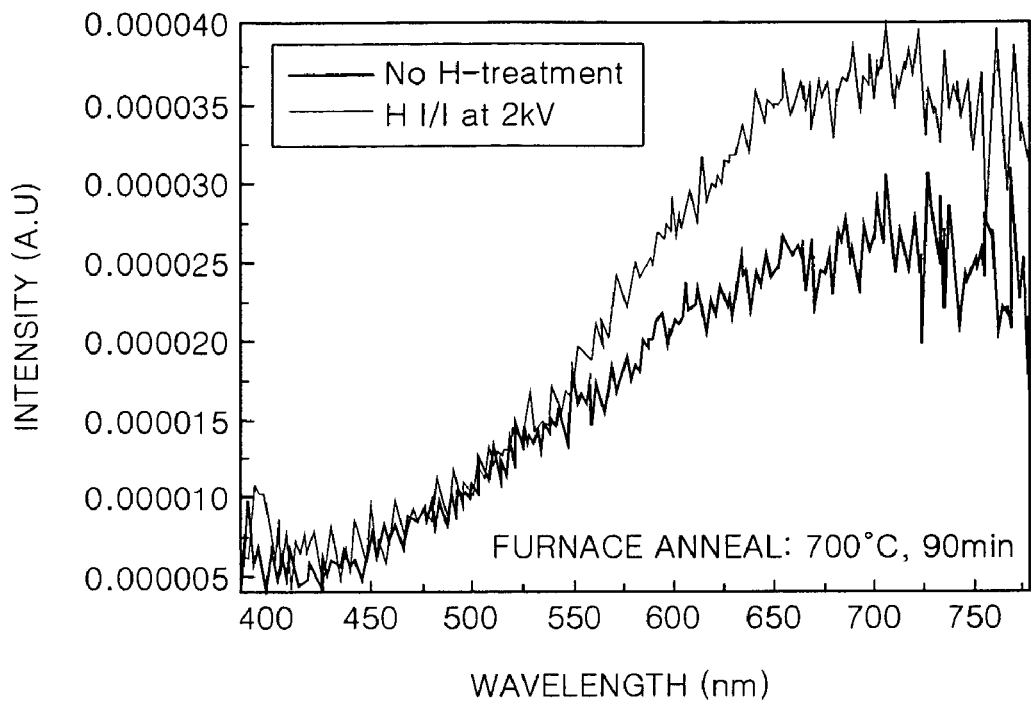
FIG. 1 is a graph showing photoluminescence characteristics of a conventional silicon ion-implanted sample versus photoluminescence characteristics of a hydrogen ion-implanted sample formed using a method according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the two FIGS. shown in succession may in fact be executed substantially concurrently or may sometimes be executed in the reverse order, depending upon the functionality/acts involved.

At least one example embodiment of the present invention provides a method for forming a non-volatile memory including silicon nano-crystals. According to this example method, an insulating layer having a desired or suitable thickness may be formed on a silicon substrate. The insulating layer may be formed of, for example, $SiO_2$ or any other suitable insulating material. Higher-concentrated silicon and hydrogen may be implanted in the insulating layer using plasma ion implantation with a lower energy in a gas atmosphere. In the gas atmosphere hydrogen may serve as a balance gas, and the concentration of $SiH_4$ may less than or equal to about 5%. The energy used in the ion implantation may be less than or equal to about 500 eV. Silicon nano-crystals may be formed using a catalyst effect of hydrogen occurring during a heat treatment at a temperature of about 400° C. to about 650° C., inclusive.

In another method, according to an example embodiment of the present invention, a tunnelling insulating layer having a desired, given or suitable thickness may be formed on a silicon substrate. A silicon nitride layer may be formed on the tunnelling insulating layer. The thickness of the tunneling insulating layer may be about 5 nm. More highly concentrated silicon and hydrogen may be implanted in the insulating layer using plasma ion implantation with a lower energy in a gas atmosphere in which hydrogen may serve as a balance gas. The concentration of $SiH_4$ may be less than or equal to about 5%. The energy used in the plasma ion implantation may be less than or equal to about 500 eV. Silicon nano-crystals may be formed using a catalyst effect of hydrogen during a heat treatment at about 400° C. to about 650° C., inclusive. An $SiO_2$, high-k or any other suitable insulating layer may be formed on the silicon nano-crystals. The insulating layer may be formed using a chemical vapor deposition (CVD) or any other suitable deposition process, and may be used as a blocking oxide.

Figure 2:
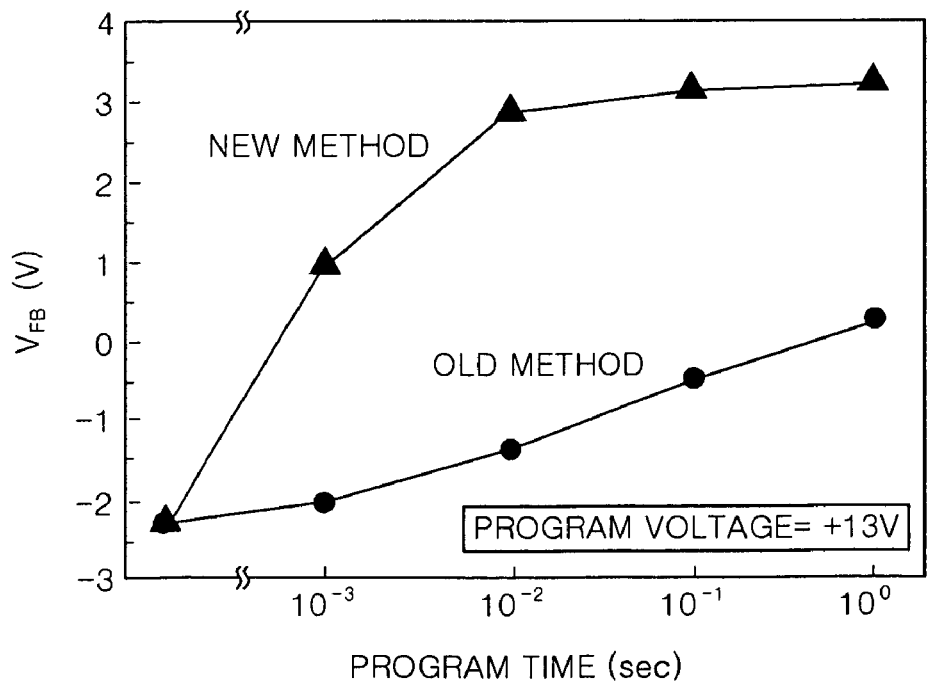
FIG. 2 is a graph of program speed for nano-crystals formed using a related art method and a method, according to an example embodiment of the present invention.
Figure 3:
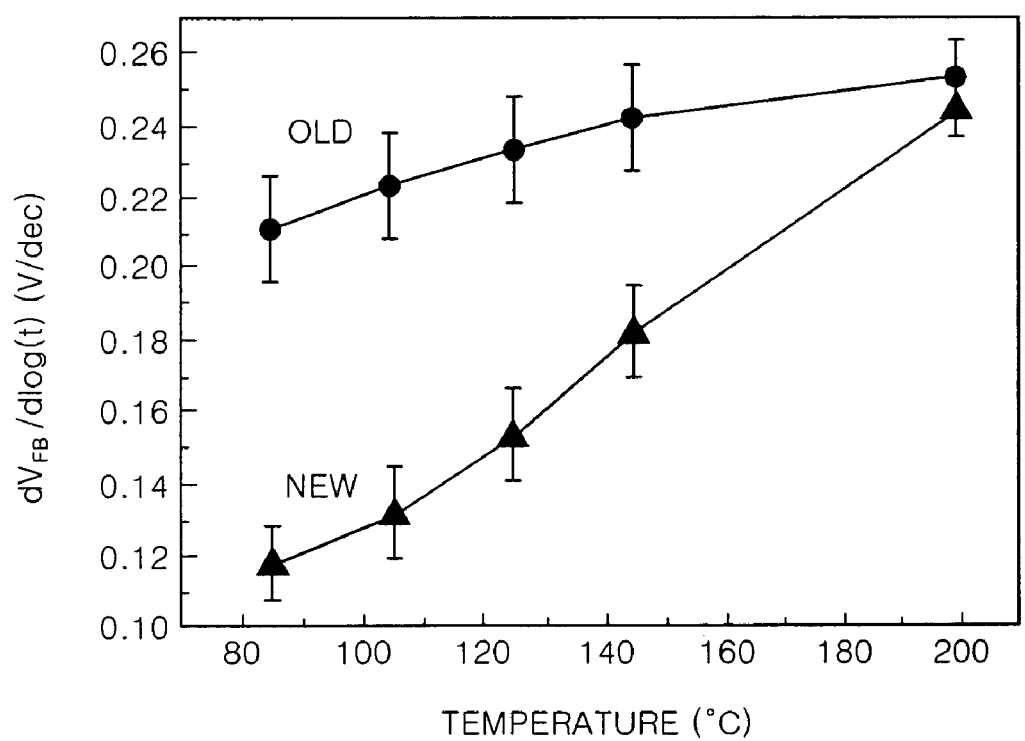
FIG. 3 is a graph of charge detrapping characteristics versus temperature for nano-crystals formed using a related art method and a method according to an example embodiment of the present invention.

FIGS. 1-3 illustrate example experimental results comparing related art silicon-ion only implanted nano-crystal sample and a nano-crystal sample formed according to an example embodiment of the present invention in which hydrogen plasma ion implantation was performed in addition to the related art silicon ion implantation. The two samples were heat-treated under the same conditions.

FIG. 1 shows photoluminescence (PL) characteristics of the conventional silicon ion-implanted sample and a sample formed according to an example embodiment of the present invention. A higher intensity of PL is more conducive to an increase in density of more highly concentrated nano-crystals. As shown in FIG. 1, through a PL analysis, an intensity of the sample formed according to an example embodiment of the present invention (e.g., including hydrogen) may be higher, which may result in a higher density of nano-crystals.

FIG. 2 is a graph of program speed showing that the program speed of a semiconductor device including nano-crystals formed according to example embodiments of the present invention may increase. For example, a program speed of a hydrogen-processed nano-crystal sample formed according to an example embodiment of the present invention may be faster at the same or substantially the same applied voltage. This may also be indicative of an increased density of nano-crystals.

FIG. 3 is a graph of charge detrapping characteristics versus temperature for a nano-crystal sample formed using a related art method and a nano-crystal sample formed using an example embodiment of the present invention. As shown, a charge detrapping rate of a device including nano-crystals formed according to an example embodiment of the present invention may be lower and the device may be suitable for a nonvolatile memory. For example, after programming when evaluating electron emission characteristics at higher temperatures, characteristics of samples formed according to an example embodiment of the present invention may be relatively stable. Thus, the density of nano-crystals formed according to an example embodiment of the present invention may be higher, more uniform and kept at equivalent or substantially equivalent intervals.

As described above, according example embodiments of the present invention, in order to more effectively form more highly concentrated silicon nano-crystals in a thinner (e.g., ultra-thin) insulating layer, an ion (e.g., an $Si^+$or any other suitable ion) and an amount (e.g., a larger amount) of hydrogen may be implanted in the insulating layer using, for example, $SiH_4/H_2$ plasma ion implantation with a lower energy (e.g., less than or equal to about 500 eV) such that the silicon nano-crystals may be more highly concentrated as compared to those formed using related art ion implantation processes.

Example embodiments of the present invention may also reduce time and/or process costs associated with more highly concentrated ion implantation due to a lower density of ion beam at a lower energy and/or a plasma doping process.

While some example embodiments of the present invention have been particularly shown and described with reference to the drawings, various changes in form and details may be made therein without departing from the spirit and scope of the present invention as defined by the following claims.

What is claimed is:

1. A method for forming silicon nano-crystals using plasma ion implantation, the method comprising:
   forming an insulating layer on a substrate;
   implanting ions into the insulating layer using hydrogen and a gas including silicon; and forming silicon nano-crystals using a heat treatment, wherein the ions are implanted in a gas atmosphere in which hydrogen serves as a balance gas.

2. The method of claim 1, wherein the insulating layer is $SiO_2$.

3. The method of claim 1, wherein the insulating layer includes at least one of $Si_3N_4$ and $SiO_2$.

4. The method of claim 1, wherein forming the insulating layer further includes,
   forming a first layer including $SiO_2$, and
   forming a second layer including $Si_3N_4$ on the first layer.

5. The method of claim 1, wherein the insulating layer is a high-k insulating layer.

6. The method of claim 5, wherein the high-k insulating layer includes $HfO_2$.

7. The method of claim 1, wherein the gas including silicon is $SiH_4$.

8. The method of claim 1, wherein the gas including silicon is Disilane ($Si_2H_6$).

9. The method of claim 1, wherein the heat treatment is performed at a temperature of about 550° C. to about 1000° C., inclusive.

10. The method of claim 1, wherein the ion implantation energy is less than or equal to about 1 KeV.

11. The method of claim 1, wherein a concentration of the ion-implanted silicon is greater than or equal to about $1 \times 10^{16}$ per $cm^2$.

12. The method of claim 1, wherein a concentration ratio of hydrogen is greater than or equal to about 90%.

13. The method of claim 1, wherein an insulating layer is formed on the silicon nano-crystals.

14. The method of claim 13, wherein the insulating layer formed on the silicon nano-crystals is one of $SiO_2$ or a high-k insulating layer.

15. The method of claim 1, wherein the insulating layer is formed using chemical vapor deposition (CVD).

16. A semiconductor memory device including silicon nano-crystals, the silicon nano-crystals being formed using the method of claim 1.

17. A method for forming a semiconductor memory device including silicon nano-crystals, the method comprising:
    forming silicon nano-crystals according to the method of claim 1; and
    forming a semiconductor memory device using the formed nano-crystals.

18. The method of claim 17, wherein the insulating layer is $SiO_2$.

19. The method of claim 17, wherein the insulating layer includes at least one of $Si_3N_4$ and $SiO_2$ or the insulating layer is a high-k insulating layer.

20. The method of claim 17, wherein the gas including silicon is $SiH_4$ or Disilane ($Si_2H_6$).

* * * * *